US010411067B2

(12) United States Patent
Then et al.

(10) Patent No.: US 10,411,067 B2
(45) Date of Patent: Sep. 10, 2019

(54) INTEGRATED RF FRONTEND STRUCTURES

(71) Applicant: INTEL CORPORATION, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/777,511

(22) PCT Filed: Dec. 21, 2015

(86) PCT No.: PCT/US2015/067026
§ 371 (c)(1),
(2) Date: May 18, 2018

(87) PCT Pub. No.: WO2017/111892
PCT Pub. Date: Jun. 29, 2017

(65) Prior Publication Data
US 2018/0331156 A1    Nov. 15, 2018

(51) Int. Cl.
*H01L 21/8238*    (2006.01)
*H01L 27/20*    (2006.01)
(Continued)

(52) U.S. Cl.
CPC .......... *H01L 27/20* (2013.01); *H01L 21/0254* (2013.01); *H01L 21/30604* (2013.01);
(Continued)

(58) Field of Classification Search
None
See application file for complete search history.

(56) References Cited

U.S. PATENT DOCUMENTS 8,659,030 B2    2/2014  Briere
2002/0167023 A1    11/2002  Chavarkar et al.
(Continued)

FOREIGN PATENT DOCUMENTS

WO    2017/111892 A1    6/2017

OTHER PUBLICATIONS

International Search Report and Written Opinion received for PCT Application No. PCT/US2015/067026/ dated Sep. 19, 2016. 12 pages.
(Continued)

*Primary Examiner* — Minh Loan Tran
(74) *Attorney, Agent, or Firm* — Finch & Maloney PLLC

(57) ABSTRACT

Techniques are disclosed for forming a monolithic integrated circuit semiconductor structure that includes a radio frequency (RF) frontend portion and may further include a CMOS portion. The RF frontend portion includes componentry implemented with column III-N semiconductor materials such as gallium nitride (GaN), indium nitride (InN), aluminum nitride (AlN), and compounds thereof, and the CMOS portion includes CMOS logic componentry implemented with semiconductor materials selected from group IV of the periodic table, such as silicon, germanium, and/or silicon germanium (SiGe). Either of the CMOS or RF frontend portions can be native to the underlying substrate to some degree. The techniques can be used, for example, for system-on-chip integration of III-N transistors and/or RF filters, along with column IV CMOS devices on a single substrate. In a more general sense, the techniques can be used for SoC integration of an RF frontend having diverse III-N componentry on a single substrate, in accordance with some embodiments.

20 Claims, 8 Drawing Sheets

(51) Int. Cl.
| | |
|---|---|
| H01L 21/8258 | (2006.01) |
| H01L 27/06 | (2006.01) |
| H01L 29/20 | (2006.01) |
| H03H 9/05 | (2006.01) |
| H01L 21/02 | (2006.01) |
| H01L 21/306 | (2006.01) |
| H01L 21/311 | (2006.01) |
| H01L 27/092 | (2006.01) |
| H01L 29/205 | (2006.01) |
| H01L 29/66 | (2006.01) |
| H01L 29/778 | (2006.01) |
| H01L 41/187 | (2006.01) |
| H01L 41/314 | (2013.01) |
| H03H 3/02 | (2006.01) |
| H03H 9/17 | (2006.01) |
| H03H 9/56 | (2006.01) |
| H01L 29/08 | (2006.01) |
| H01L 21/762 | (2006.01) |

(52) U.S. Cl.
CPC .... *H01L 21/31116* (2013.01); *H01L 21/8238* (2013.01); *H01L 21/8258* (2013.01); *H01L 27/0605* (2013.01); *H01L 27/0617* (2013.01); *H01L 27/0924* (2013.01); *H01L 29/2003* (2013.01); *H01L 29/205* (2013.01); *H01L 29/66462* (2013.01); *H01L 29/66795* (2013.01); *H01L 29/7787* (2013.01); *H01L 41/187* (2013.01); *H01L 41/314* (2013.01); *H03H 3/02* (2013.01); *H03H 9/0542* (2013.01); *H03H 9/173* (2013.01); *H03H 9/562* (2013.01); *H03H 9/564* (2013.01); H01L 21/76224 (2013.01); H01L 27/0922 (2013.01); H01L 29/0847 (2013.01); H01L 29/7786 (2013.01); H03H 2003/021 (2013.01)

(56) References Cited

U.S. PATENT DOCUMENTS

| | | |
|---|---|---|
| 2011/0180857 A1 | 7/2011 | Hoke et al. |
| 2013/0271208 A1 | 10/2013 | Then et al. |
| 2013/0344819 A1 | 12/2013 | Ozgur et al. |
| 2014/0158976 A1 | 6/2014 | Dasgupta et al. |
| 2014/0231870 A1 | 8/2014 | Hoke |
| 2014/0367777 A1* | 12/2014 | Huang .............. H01L 21/76251 257/337 |

OTHER PUBLICATIONS

International Preliminary Report on Patentability received for PCT Application No. PCT/US2015/067026/ dated Jun. 26, 2018. 7 pages.

Aigner, "MEMS in RF Filter Applications: Thin-film Bulk Acoustic Wave Technology," Published in: The 13th International Conference on Solid-State Senors, Actuators and Microsystems, 2005. Digest of Technical Papers. 36 pages.

Colino, Stephen L. and Robert A. Beach, "Fundamentals of Gallium Nitride Power Transistors," EPC-Efficient Power Conversion Corporation, www.epc-co.com, copyright 2011. 4 pages.

Semiconductor Today, "Si implant enhances AlN spacer HEMT drain current," Jul. 2, 2011. 3 pages.

Then, et al., "High-Performance Low-Leakage Enhancement-Mode High-K Dielectric GaN MOSHEMTsfor Energy-Efficient, Compact Voltage Regulators and RF Power Amplifiers for Low-Power Mobile SoCs," VLSI Symposium, Jun. 2015. 2 pages.

Kazior, et al., "High performance mixed signal and RF circuits enabled by the direct monlithyic heterogeneous integration of GaN HEMTs and Si CMOS on a silicon substrate," IEEE, Compound Semiconductor Integrated Circuit Symposium (CSICS), Oct. 2011. 4 pages.

Hoke, et al., "Monolithic integration of silicon CMOS and GaN transistors in a current mirror circuit," Journal of Vacuum Science and Technology B, 2012, vol. 30, No. 2, article No. 02B101. 7 pages.

* cited by examiner

INTEGRATED RF FRONTEND STRUCTURES

BACKGROUND

Mobile computers, such as smartphones, include various circuits between the antenna and the digital baseband system, generally referred to as the "radio frequency (RF) frontend." A typical RF frontend includes RF filters, low-noise amplifiers (LNAs), RF power amplifiers, and RF switches, each of which may be located on a separate integrated circuit chip.

BRIEF DESCRIPTION OF THE DRAWINGS

FIG. 2M' is a transmission electron microscopy (TEM) image illustrating a cross-sectional side view of an example III-N transistor formed in accordance with an embodiment of the present disclosure.

Figure 1:
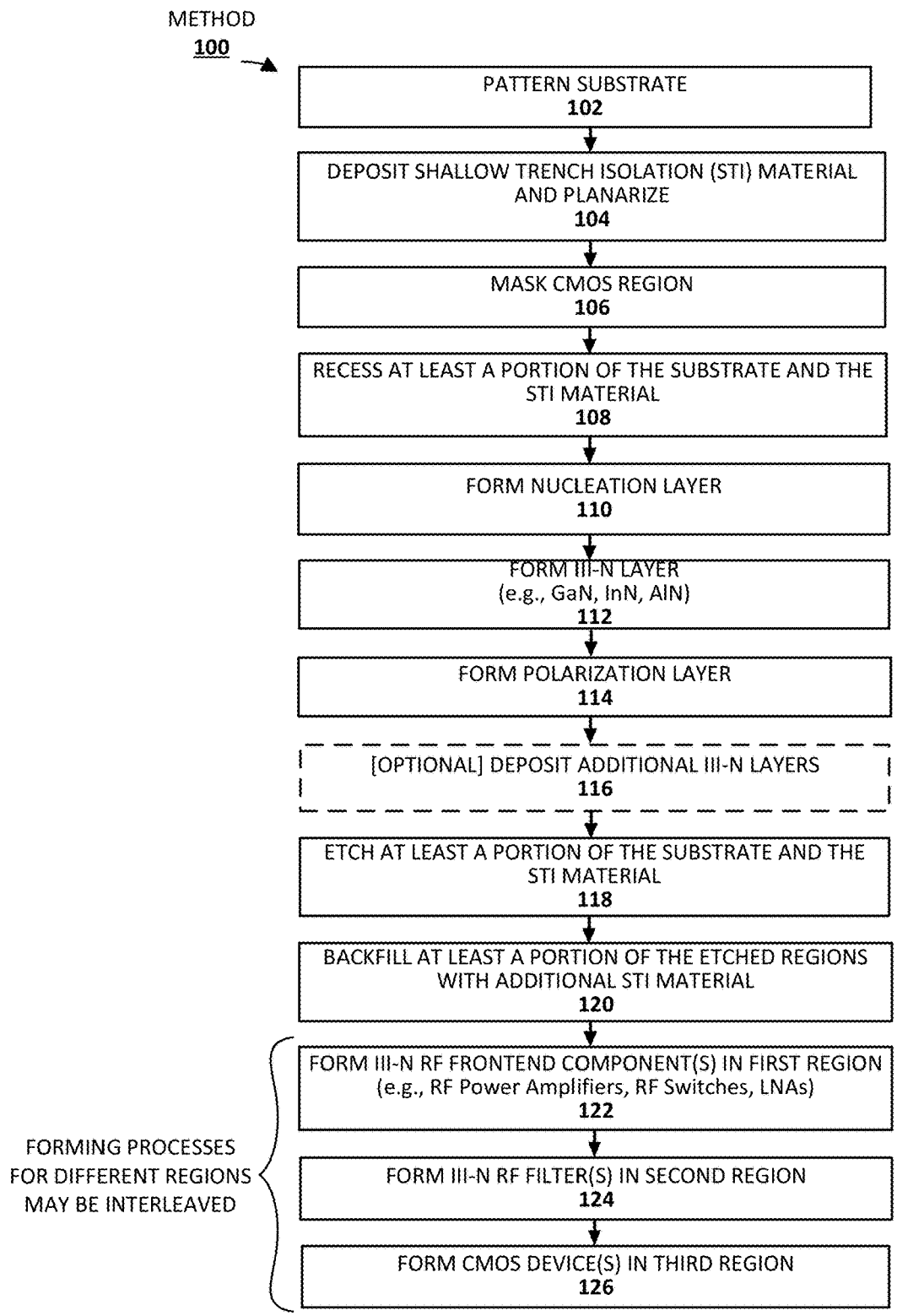
FIG. 1 illustrates an example methodology for producing an integrated circuit in accordance with one or more embodiments of the present disclosure.

As will be appreciated, the figures are not necessarily drawn to scale or intended to limit the disclosure to the specific configurations shown. For instance, while some figures generally indicate straight lines, right angles, and smooth surfaces, an actual implementation of a structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming a monolithic integrated circuit semiconductor structure that may include a radio frequency (RF) frontend portion and may further include a complementary metal oxide semiconductor (CMOS) portion. In some embodiments, the RF frontend portion may include componentry implemented with column III-N semiconductor materials such as gallium nitride (GaN), indium nitride (InN), aluminum nitride (AlN), and compounds thereof, and the CMOS portion may include CMOS logic componentry implemented with column a semiconductor substrate comprising a material selected from group IV of the periodic table, such as silicon, germanium, and/or silicon germanium (SiGe). Either of the CMOS or RF frontend portions may be native to the underlying substrate to some degree. For instance, the substrate in one embodiment may be a silicon wafer upon which the RF frontend and CMOS portions are formed. In one such example embodiment, the CMOS portion may be native to the substrate (e.g., the CMOS componentry may be implemented with the same column IV semiconductor material as the substrate), but need not be. For example, in some embodiments, there may be an intervening layer between the substrate and the CMOS componentry, such as, for example, an epitaxial silicon layer. As will be appreciated in light of this disclosure, the techniques can be used, for example, for system-on-chip (SoC) integration of III-N transistors and/or RF filters, along with column IV CMOS devices on a single substrate, in accordance with some embodiments. In a more general sense, the techniques can be used for SoC integration of an RF frontend having diverse III-N componentry on a single substrate, in accordance with some embodiments. Numerous other configurations and variations will be apparent in light of this disclosure.

General Overview

Typical RF frontend technology in today's smartphone may include multiple RF power amplifiers, multiple RF switches, multiple RF filters and multiple LNAs. Each of these components is located on separate chips and implemented using disparate technologies. As various vendors produce the components, integration of all of the necessary frontend components can be challenging. As device dimensions continue to scale down, integration of various RF frontend components gives rise to a number of non-trivial challenges. There are currently no fully integrated RF frontends due to the different technologies required for each application. For example, while gallium arsenide (GaAs) is well-suited for RF power amplifiers, RF switches and LNAs, it lacks RF filter capability as well as the CMOS technology used for fabricating the control logic. Additionally, while silicon is well-suited for CMOS control logic and silicon-on-insulator (SOI) is well-suited for RF switches, RF power amplifiers implemented on silicon have severely degraded efficiencies. Moreover, silicon RF switches require series stacking of up to 14 transistors to withstand the large (e.g., approximately 35V) operating voltages typically experienced by the RF frontend. Stacking such a large number of transistors undesirably decreases the On resistance proportionally and as a result the transistor width must be increased accordingly. This larger footprint consumes more chip space and the transistor stack further contributes to parasitics.

Thus, and in accordance with some embodiments of the present disclosure, techniques are provided for forming integrated RF frontend solutions in a monolithic structure. In one example case, a monolithic integrated circuit semiconductor structure is provided that includes both a radio frequency (RF) frontend portion and a complementary metal oxide semiconductor (CMOS) portion. The RF frontend portion may include componentry implemented with column III-N semiconductor materials such as gallium nitride (GaN), indium nitride (InN), aluminum nitride (AlN), and compounds thereof, and the CMOS portion may include CMOS logic componentry implemented with column IV semiconductor materials such as silicon (Si), germanium (Ge), and/or silicon germanium (SiGe). The techniques can be used, for example, for system-on-chip (SoC) integration of III-N transistors and/or RF filters, along with column IV CMOS devices on a single substrate, in accordance with some embodiments. Likewise, the techniques can be used, for example, for SoC integration of III-N transistors of a first III-N material type and RF filters of a second III-N material type on a single substrate. Numerous configurations will be apparent.

In one example embodiment, the monolithic structure may be implemented with a silicon wafer or substrate having one or more III-N material sections embedded or otherwise formed on or within the substrate that are configured with RF frontend componentry such as, for instance, one or more power transistors, RF switches, RF power amplifiers, RF filters and/or low noise amplifiers (LNAs). In addition, one or more column IV material sections embedded or otherwise formed within, from, on, or over the substrate may be configured with CMOS componentry such as, for instance, control logic features and/or semiconductor-on-insulator (SOI) devices. In some specific such example embodiments, the RF frontend portion may include a GaN layer configured with GaN based RF switches, RF power amplifiers, and LNAs. In addition, the RF frontend portion may further include an AlN layer configured with one or more AlN based RF filters. In some embodiments, the CMOS portion may be silicon that is native to the substrate and configured with CMOS logic. Alternatively, the CMOS portion may be a replacement material such as germanium or SiGe, or some combination of replacement materials provided on the silicon wafer, in some embodiments.

Other embodiments may include any suitable combination of III-N materials and column IV materials (e.g., any combination of GaN, InN, or AlN based RF componentry along with any combination of silicon, germanium or SiGe based componentry) formed from, in, on, and/or over any suitable single substrate. Still other embodiments may include any suitable combination of diverse III-N materials (e.g., one or more GaN power transistors along with one or more AlN RF filters) formed from, in, on, and/or over any suitable single substrate. Note that the layer(s) configured with a given CMOS portion need not be native to the underlying substrate; nor do the layer(s) configured with a given RF frontend portion need to be native to the underlying substrate. Numerous configurations and variations will be apparent in light of this disclosure.

As will be appreciated in light of this disclosure, GaN provides significant advantages in applications such as RF power amplification, RF switching and RF filtering. For instance, GaN has a wide bandgap of 3.4 eV (e.g., compared to the 1.4 eV bandgap of GaAs), therefore allowing GaN transistors to withstand larger electric fields (applied voltage, $V_{DD}$) before suffering breakdown. For example, the electric field that GaN transistors can withstand may be magnitudes larger than that of a GaAs transistor of similar dimensions can withstand before suffering breakdown. Due to its wide bandgap, GaN is particularly suited for RF power amplifiers. Its high mobility and large charge density allow GaN transistors to achieve low On resistance, resulting in high RF power-added efficiencies at high RF output power densities. These properties offer significant advantages over GaAs and Si RF power amplifiers. GaN transistors may also be scaled down to even smaller physical dimensions while operating at the same $V_{DD}$, thereby enabling smaller on-resistance, smaller capacitance and smaller transistor widths, resulting in benefits such as reduced power dissipation, higher circuit efficiencies, and smaller form factor. Additionally, the wide bandgap nature of GaN is also suitable for achieving low parasitic leakage currents. For example, wide bandgap eliminates band-to-band tunneling, gate-induced drain leakage (GIDL) and hot electron avalanche effects. These properties are advantageous, for example, for RF switch applications. GaN RF switches thus have the advantage of small transistor width, high output power handling and good isolation during OFF state. Due to its piezoelectricity, aluminum nitride (AlN) is particularly useful for implementing high performance RF filters, such as film bulk acoustic resonators (FBARs) and, in some embodiments, AlN may be included in the GaN transistor buffer.

The monolithic semiconductor structures variously described herein may be suitable for numerous applications, such as the personal computers (PC), tablet computers, smartphones, power management and communication applications, as well as power conversion and automotive applications, to name a few examples. Numerous configurations and variations will be apparent in light of this disclosure.

Architecture and Methodology

FIG. 1 illustrates a method 100 of forming an integrated circuit in accordance with one or more embodiments of the present disclosure. FIGS. 2A-2M illustrate example integrated circuit structures that may be formed when carrying out method 100 of FIG. 1, in accordance with some embodiments. As will be apparent in light of the structures formed in FIGS. 2A-2M, method 100 discloses techniques for forming one or more GaN transistors, one or more III-N components (such as GaN transistors and/or AlN RF filters) and one or more CMOS devices on a single substrate. Various transistor geometries can be formed using the techniques described herein, including, but not limited to, field effect transistors (FETs) for both logic switching and power switching, high-electron-mobility transistors (HEMTs), pseudomorphic high-electron-mobility transistors (pHEMT), transistors employing 2DEG architecture, transistors employing 3DEG (or 3D polarization FET) architecture, and transistors employing multiple quantum-wells (MQW) or super-lattice architecture. It will be understood that the disclosed techniques may be used to form various types of GaN transistors, such as those used to form GaN RF switches, RF power amplifiers and/or LNAs. The disclosed techniques may also be used to form various types of RF Filters, such as, for example, surface acoustic wave (SAW), temperature-compensated (TC-SAW) and bulk acoustic wave (BAW) filters, including thin-film bulk acoustic resonators (FBARs). In addition, the disclosed techniques may also be used to form CMOS control logic devices, including transistors, devices, and/or circuits.

Figure 2A:
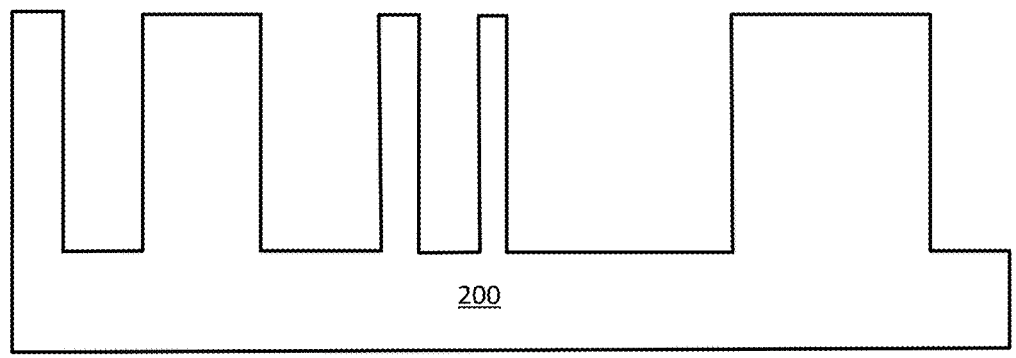
FIGS. 2A-2M illustrate cross-section side views of a series of integrated circuit structures that may be formed when carrying out the method of FIG. 1, in accordance with various embodiments of the present disclosure.

As shown in FIG. 1, method 100 includes patterning 102 a substrate 200 to form the resulting structure shown in FIG. 2A, in accordance with an example embodiment. Substrate 200 may be patterned by any suitable technique, including by masking, lithography and etching (wet and/or dry) processes. While the structure shown in FIG. 2A includes trenches and fins of specific dimensions, substrate 200 can be patterned to have trenches and fins of varying widths and heights, depending on the end use or target application. Similarly, although substrate 200 is shown with five trenches, any number of trenches may be formed, such as one, greater than one, two, ten, hundreds, thousands, millions, etc., depending on the end use or target application. Substrate 200 may comprise Si, SiGe, Ge, or any combination thereof, in some embodiments. In some particular embodiments, substrate 200 may be a bulk substrate of Si, SiGe, or Ge. As used herein, the term "bulk substrate" shall be understood to mean, in addition to its plain and ordinary meaning, any substrate formed entirely of a single type of semiconductor material (e.g., without any insulator layers). In still other embodiments, substrate 200 may be a multi-layer structure, or an X on insulator (XOI) structure where X comprises a semiconductor such as Si, SiGe, or Ge, and the insulator material is an oxide material or dielectric material or some other electrically insulating material or some other suitable multilayer structure where the top layer comprises Si, SiGe, or Ge. For example, in some embodiments, the substrate may be a bulk Si substrate with a buffer layer of SiGe or Ge on top of a portion of the bulk Si substrate, where that buffer layer can be used for substrate 200 as variously described herein. The bulk Si substrate may be of high resistivity (e.g., greater than 10 ohm-cm), in some example applications. In still other embodiments, the substrate 200 may be a III-V material substrate, such as gallium arsenide or gallium nitride or aluminum nitride. As will be appreciated in light of this disclosure, such a III-V material substrate 200 could be used to allow at least some of the RF frontend componentry to be native to the substrate 200. In a more general sense, the substrate 200 may be any underlying base of material or materials upon which it is appropriate to form the structures described herein, as will be appreciated.

Figure 2B:
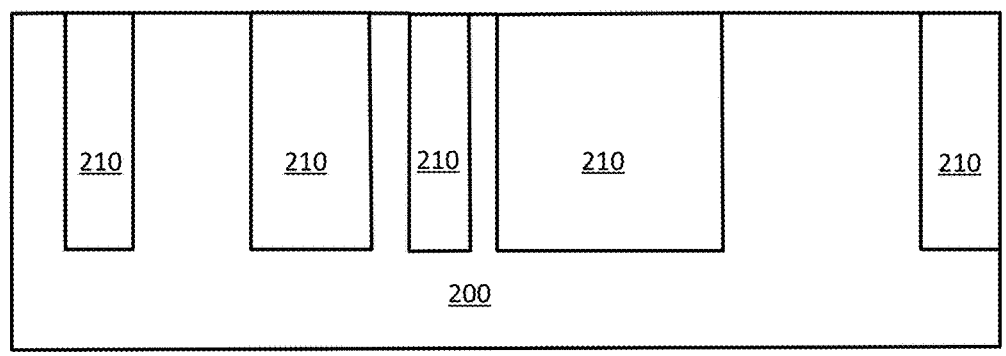

Method 100 of FIG. 1 continues with depositing 104 shallow trench isolation (STI) material 210 and planarizing to form the resulting example structure shown in FIG. 2B, in accordance with an example embodiment. STI material 210 may be deposited by any suitable technique, such as by chemical vapor deposition (CVD), atomic layer deposition (ALD), physical vapor deposition (PVD), or any other appropriate process. STI material 210 may comprise any suitable insulating material, such as one or more oxides (e.g., silicon dioxide) and/or nitrides (e.g., silicon nitride). In some embodiments, the STI material 210 may be selected based on the substrate material. For example, in the case of a silicon substrate 200, STI material 210 may be silicon dioxide or silicon nitride. Some embodiments may use a high-k dielectric to provide a greater degree of electrical isolation, if so desired. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the STI material 210 to improve its quality, particularly when a high-k material is used.

Figure 2C:
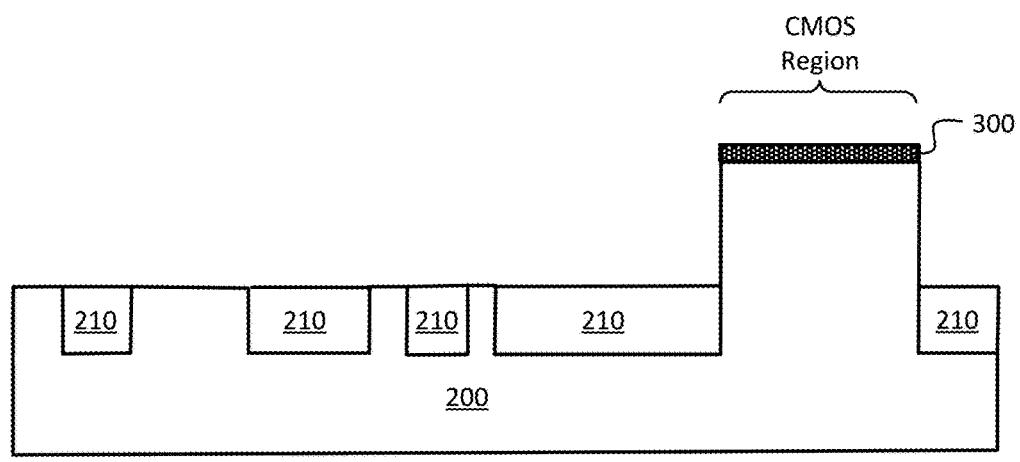

Method 100 of FIG. 1 continues with masking 106 the CMOS region with masking material 300 and recessing 108 at least a portion of the substrate 200 and the STI material 210 to form the resulting example structure shown in FIG. 2C, in accordance with an example embodiment. Note that the masked off portion of the substrate 200 is unaffected by the recessing process and will can ultimately be used as the CMOS portion of the monolithic structure. Masking material 300 may comprise any suitable hardmask materials, such as various oxide or nitride materials, for example, such as silicon oxide, silicon nitride, titanium oxide, hafnium oxide, aluminum oxide, titanium nitride, or other suitable masking material. Substrate 200 and/or STI material 210 may be recessed by any suitable technique, such as by wet and/or dry etch processes. The etchants may be selected based on the materials of the substrate and/or STI material 210, as normally done.

Figure 2D:
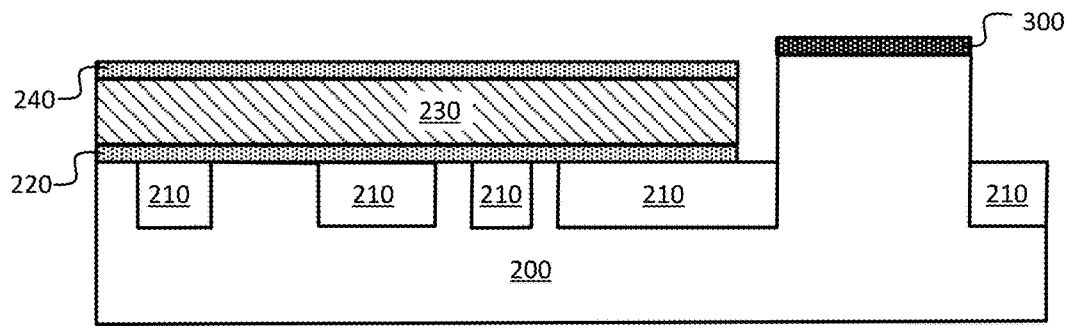

Method 100 of FIG. 1 continues with forming 110 a nucleation layer 220, forming 112 a III-N layer 230 and forming 114 a polarization layer 240 to produce the resulting example structure shown in FIG. 2D, in accordance with an example embodiment. In this example case, the III-N layer 230 comprises gallium nitride (GaN), but other III-N materials can be used as well, such as aluminum nitride (AlN) or indium nitride (InN). In some embodiments, nucleation layer 220 may comprise a III-V material, such as, for example, aluminum nitride (AlN), aluminum indium nitride (AlInN), aluminum gallium nitride (AlGaN), indium gallium nitride (InGaN), aluminum indium gallium nitride (AlInGaN), and/or gallium nitride (GaN), including a low temperature GaN (e.g., deposited at a temperature in the range of 700° C. to 950° C.). In some embodiments the nucleation layer 220 may have a thickness of less than 50 nm, such as approximately 20 nm, or any other suitable thickness depending on the end use or target application. In some embodiments the III-N layer 230 comprises at least 50%, at least 60%, at least 70%, at least 80%, at least 90%, at least 95%, or 100% GaN. In some embodiments, the III-N layer 230 may be approximately 1 micron in thickness (e.g., approximately 1 micron high when deposited) or less, or any other suitable thickness, although the thickness can vary from one embodiment to the next as will be appreciated in light of this disclosure. In some embodiments, the polarization layer 240 may comprise aluminum nitride (AlN), aluminum gallium nitride (AlGaN), indium aluminum nitride (InAlN), indium aluminum gallium nitride (InAlGaN), any mixture thereof, or any other suitable material, as will be apparent in light of this disclosure. In some embodiments, the polarization layer 240 may be less than 50 nm in thickness, such as approximately 20-30 nm, or any other suitable thickness depending on end use or target application. In some embodiments, nucleation layer 220 may prevent the III-N layer 230 from reacting with the substrate material (e.g., in the regions where the III-N layer 230 would otherwise be directly deposited on substrate 200).

In some embodiments, nucleation layer 220, III-N layer 230 and/or polarization layer 240 may be epitaxially grown, such as by liquid phase epitaxy (LPE), metal-organic chemical vapor deposition (MOCVD), molecular beam epitaxy (MBE), or any other suitable deposition process. In some embodiments, growth conditions may be adjusted based on the desired resulting characteristics of the layers. For example, in some cases where MOCVD is used, the temperature may be increased and/or the pressure may be decreased and/or the V/III ratio (e.g., the ratio of $N_2$ to Ga precursor gas flows) may be increased to cause the lateral component of layers 230 and 240 to grow faster, thereby maintaining the layers 230 and 240 as thin as possible in the vertical direction of the layer. In some embodiments, nucleation layer 220 may be formed prior to the formation of III-N layer 230. In some of these and other embodiments, polarization layer 240 may be formed subsequent to formation of the III-N layer 230.

Method 100 of FIG. 1 continues with optionally depositing 116 one or more additional III-N layers. As will be appreciated in light of this disclosure, if present, the one or more additional III-N layers may be utilized in conjunction with III-N layer 230 to form multiple quantum-well (MQW) or super-lattice transistor structures, 3D polarization FETs, or 3DEG transistors. For example, in some embodiments one or more additional sets of 2DEG layers (e.g., a GaN layer and a polarization layer) can be deposited over the GaN layer and polarization layer. In some embodiments, one set, five sets, 10 sets, 100 sets, etc. of 2DEG layers could be formed. In a more general sense, the various III-N layers provided can be used to fabricate RF frontend componentry such as RF switch, RF power amps, LNAs, and RF filters, depending on the needs of the desired application.

Figure 2E:
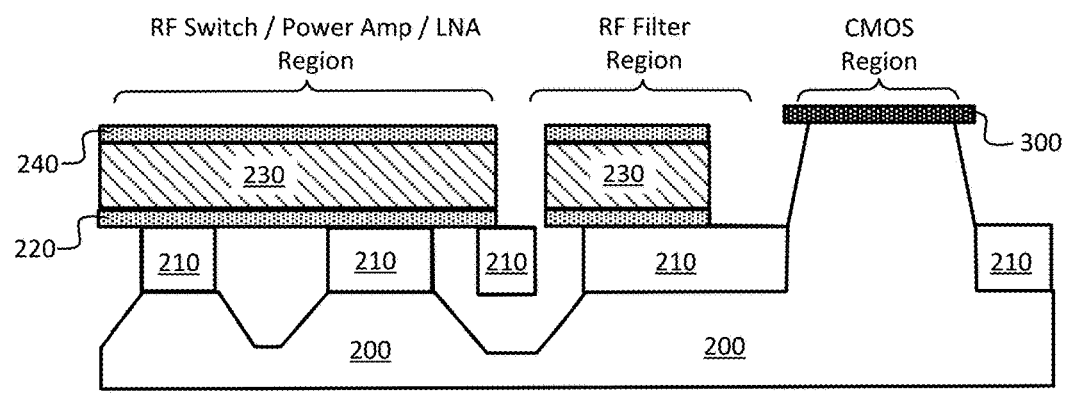

Method 100 of FIG. 1 continues with etching 118 at least a portion of the underlying substrate 200 and the STI material 210, in accordance with an example embodiment. An example resulting structure is shown in FIG. 2E, according to an embodiment. In some embodiments, etching 118 may be performed using a wet etch process to etch the substrate material 200 under III-N layer 230. In some such embodiments, the etchant may be selective to the substrate material 200, such that it either (1) removes the substrate material 200 without etching away the STI material 210 or any III-N material layers deposited above the STI material 210 (e.g., layers 230 and 240) or (2) etches away the substrate material 200 at a faster rate than it etches away the STI material 210 and/or the III-N material layers. In some embodiments where diverse III-N RF frontend componentry is to be fabricated (e.g., such as a GaN based power transistor and an AlN based RF filter) on substrate 200, III-N layer 230 may be etched as well to define two or more distinct regions (one region for an RF switch, power amplifier, and/or LNA, and another region for an RF filter), as shown in the example structure of FIG. 2E, in accordance with some example embodiments. The III-N layer 230 may be etched, for example, using a dry etch technique, such as using chlorine or fluorine-based chemistry, or with any other suitable etch scheme. As can be further seen in FIG. 2E, polarization layer 240 and/or nucleation layer 220 may also be etched along with III-N layer 230, depending on the end use or target application. In any such example cases, once the separate III-N regions are defined, the individual regions can be individually modified or otherwise processed to fabricate the desired RF frontend componentry of that region, as will be explained in turn.

Figure 2F:
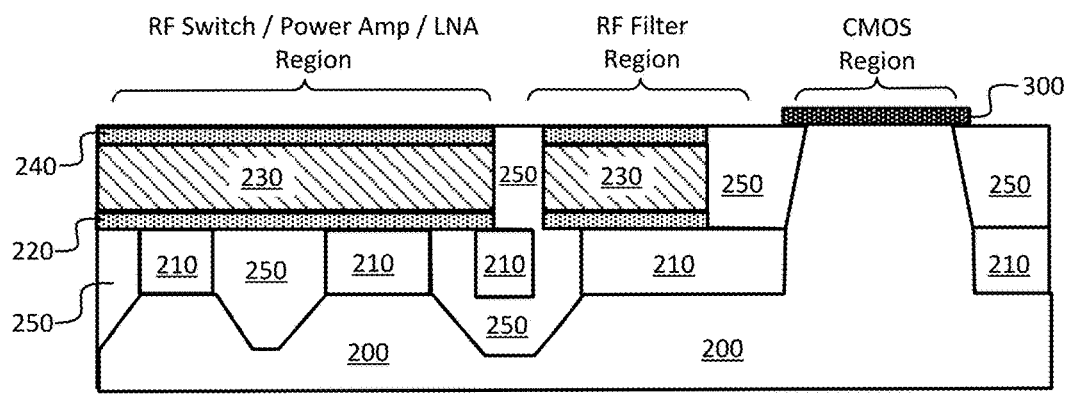

Method 100 of FIG. 1 continues with backfilling 120 at least a portion of the etched regions with additional STI material 250 to from an example structure as shown in FIG. 2F, in accordance with an example embodiment. Additional STI material 250 may be any suitable material, such as any material described above with respect to STI material 210. In some embodiments additional STI material 250 may be the same as STI material 210, while in other embodiments, additional STI material 250 may be different than STI material 210, depending on the end use or target application, including desired degree of electrical isolation. Backfilling 120 can be performed using any suitable technique, such as a spin-on process or other suitable process. In some cases, the additional STI material 250 may be reflowable, and can be subjected to high temperatures (e.g., 500-600 degrees Celsius) to facilitate a spin-based reflow backfill process.

Method 100 of FIG. 1 continues with forming 122 one or more III-N RF frontend components in a first region of the structure, forming 124 one or more III-N RF filters in a second region of the structure, and forming 126 one or more CMOS devices in a third region of the structure, in accordance with some embodiments. Various different processes can be performed to form these different regions, and the various forming processes and steps may be interleaved, such that the distinct regions can be evolved toward completion together. In addition, once the various unique features of the distinct regions have been provisioned, the overall structure can be planarized and a contact forming process can be carried out for all the regions. Such an interleaved forming process is shown in the example embodiments depicted in FIGS. 2G through 2M. Numerous variations will be appreciated in light of this disclosure.

Figure 2G:
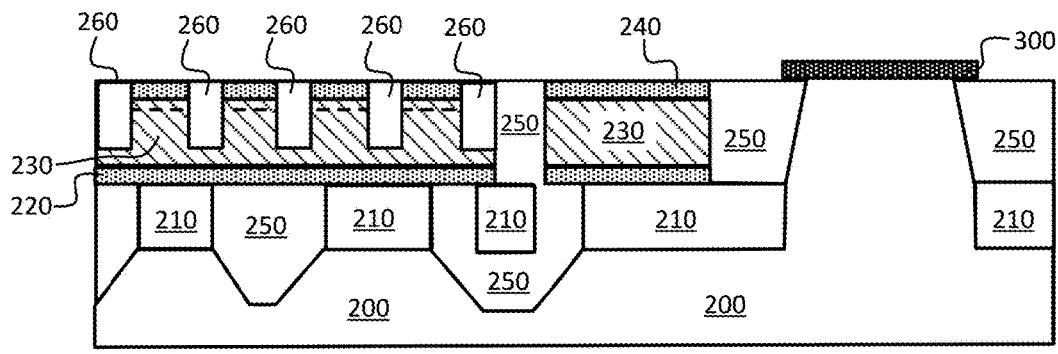

With respect to forming 122 one or more III-N RF frontend components in the first region of the structure, the methodology may include, for example, forming one or more III-N transistors, according to an embodiment. For example, FIG. 2G illustrates a plurality of III-N transistors that includes source and drain (S/D) regions 260, in accordance with an example embodiment. In this example embodiment, S/D regions 260 can be formed by masking the structure of FIG. 2F to isolate or otherwise leave exposed the areas where the S/D regions 260 will be located and a subsequent etching to remove materials in the exposed areas, including polarization layer 240 and at least a portion of III-N layer 230 to provide S/D trenches, followed by epitaxial regrowth of S/D material in those trenches to provide S/D regions 260. Further note the channel region between each S/D pair and proximate the interface of layer 230 and 240, generally indicated with a dashed line. As previously noted, the channel region may be a 2DEG configuration, although other channel configurations can be used as well. Any suitable type of masking material may be used, including but not limited to $SiO_2$, SiN, or other types of dielectric/masking materials. The S/D material may be doped prior to deposition, during deposition (in situ), or after deposition (ion implantation) to provide the desired polarity of p-type or n-type. The doping can be graded within the deposited S/D material. In some specific embodiments, the III-N layer 230 is a GaN layer and the S/D material may be, for example, indium gallium nitride (InGaN) doped with Si to form n-type S/D regions 260. In still other such example embodiments, the S/D material may be n-type gallium nitride, n-type indium gallium nitride with a graded indium composition, or any other suitable S/D material as will be apparent in light of the present disclosure. GaN transistors are particularly well-suited for RF frontend devices. After the S/D regions 260 are formed in the GaN or other suitable III-N layer 230, various other features such as spacer layer, barrier layers, gate stack, and contacts can subsequently be added as will be discussed in turn.

Figure 2H:
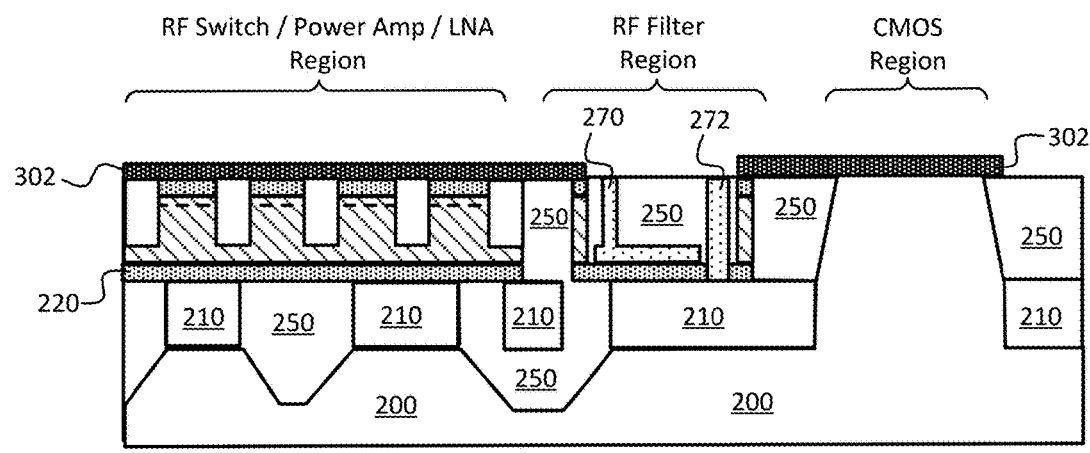

Once the S/D regions 260 are formed in layer 230, the method further includes forming 124 one or more III-N RF filters in the second region of the structure, according to an embodiment. This may include, for example, forming an example structure as shown in FIG. 2H, in accordance with an example embodiment. To form the example structure shown in FIG. 2H according to some embodiments, a protective layer 302 may be applied to the RF Switch/Power Amp/LNA region and the CMOS region. Protective layer 302 may include any suitable masking material, including any material described with respect to masking material 300 or other types of protective material, such as, for example, a photoresist. As will be appreciated, other embodiments may not include such a protective layer 302, where selective etch and deposition processes are only locally applied to the RF filter region only (and not to the RF Switch/Power Amp/LNA and CMOS regions). Various different processes can be performed in the formation of one or more III-N RF filters, including filters having various features and geometries, such as surface acoustic wave (SAW) filters including temperature-compensated (TC-SAW) filters, and/or bulk acoustic wave (BAW) filters including solidly-mounted resonator (BAW-SMR) devices and film bulk acoustic resonators (FBARs). For a BAW filter (or resonator) or FBAR, for instance, the resonance frequency is determined by the thickness of a piezoelectric layer as well as the thickness of the resonator electrodes and additional layers in which mechanical energy may be stored. In such piezoelectric resonators, an acoustic standing wave is generated within the piezoelectric layer. In this way, such filters can selectively pass RF data of interest when a signal is applied to the filter that triggers the resonant response.

FIG. 2H illustrates an example embodiment that includes an FBAR RF filter. Note, however, that the subject disclosure is not intended to be limited to FBARs and may include any other types of RF filters instead of or in addition to FBARs. In the particular example embodiment shown in FIG. 2H, polarization layer 240 and III-N layer 230 are etched away in the RF filter region to expose the underlying nucleation layer 220, which in this example embodiment is used to provide the piezoelectric layer of the FBAR. In such cases, the layer 220 may be implemented with, for example, AlN or GaN or some other suitable III-N material having piezoelectric qualities. In other embodiments, the underlying nucleation layer 220 within the RF filter region may also be etched away along with layers 230 and 240, and replaced with a piezoelectric layer. Once the piezoelectric layer is exposed or otherwise provided, the top electrode 270 and part of the bottom electrode 272 of the FBAR can be formed. The remainder of the bottom electrode 272 can be formed during subsequent processing, as will be explained in turn. The electrodes 270 and 272 can be implemented with standard deposition techniques (e.g., CVD, PVD) and any suitable electrode materials (e.g., aluminum, molybdenum, tungsten, or any other suitable electrode material). Further note that the top electrode 270 may be formed in sections. For instance, in one example process, the lower vertical portion of electrode 270 is deposited onto the underlying piezoelectric layer 270, and then the remaining empty space in the RF filter region can be filled with additional STI material 250. Then, an etch can be carried out to selectively remove STI material 250 to provide recesses where the upper vertical portion of the top electrode 270 and the upper vertical portion of the bottom electrode 272 will be deposited. After deposition of the electrode metal in those locations, the resulting filter structure can then be polished to planarize the upper surface of the RF filter region, thereby providing the structure shown in FIG. 2H. In some such embodiments, note that this polishing/planarization process can also be used to remove the mask layer 302 on the RF switch/power amp/LNA and CMOS regions, so as to prepare the structure for subsequent processing.

Once the RF filter structure is formed such as shown in FIG. 2H and the structure is planarized, additional features can be formed in the RF switch/power amp/LNA region, according to an embodiment. For instance, and with reference to the example embodiment shown in FIG. 2I, gates 280 and gate dielectric layer 281 for the III-N transistors can be provided. In some embodiments, gate dielectric layer 281 is provided with etch and deposition processes that are selective to the underlying polarization layer 240, but can also be provided using a patterned mask that isolates the area above the channel. The gate dielectric layer 281 can be, for example, an AlN spacer and an AlGaN barrier layer to provide a 2DEG configuration in conjunction with an underlying III-N layer 230 according to some embodiments, although any number of configurations can be employed to include a high-k dielectric, such as $HfO_2$, $TaSiO_x$, $ZrO_2$, $Al_2O_3$, lower-k dielectric, such as $SiO_2$, SiN and $AlSi_xO_y$, or configurations including composite stacks of high-k and low-k dielectrics, as will be appreciated. Further note that such a gate dielectric layer 281 can be provided at other points in the processing scheme. For instance, in another embodiment, the gate dielectric layer 281 can be provided prior to etching the S/D regions 260 or just after the S/D regions 260 are deposited. In any case, additional STI can be deposited over the overall structure including the gate dielectric layer 281 and planarized, and then gates 280 can be patterned, etched, and deposited into the additional STI 250 as shown with further reference to FIG. 2I. Example gate 280 materials include, for instance, aluminum, titanium, tungsten, and other suitable gate metals and alloys thereof.

Figure 2I:
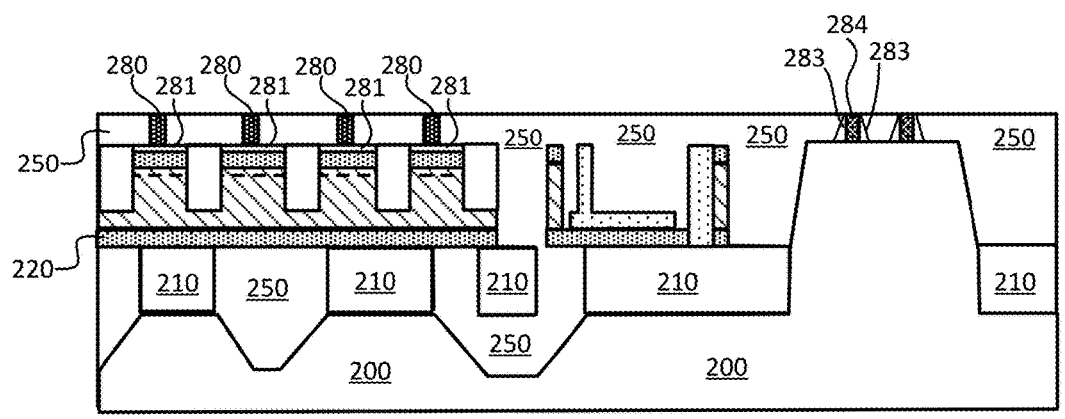

With respect to forming 126 one or more CMOS devices in the third region of the structure, CMOS gate structures can be formed, including gates stacks 284 and gate spacers 283, to produce a structure as shown in FIG. 2I, in accordance with an example embodiment. In some example embodiments, gate spacers 283 are formed and then used as a guide to form gate stack 284, which includes a gate electrode on a gate dielectric formed directly over a corresponding channel region in the substrate 200. The gate spacer, gate dielectric, and gate electrode may be formed using any suitable techniques (e.g., CVD, PVD) and from any suitable materials. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. Further, the gate electrode may comprise a wide range of materials, such as polysilicon, silicon nitride, silicon carbide, or various suitable metals or metal alloys, such as aluminum, tungsten, titanium, tantalum, copper, titanium nitride, or tantalum nitride, for example. The gate spacer 283 may be, for example, silicon nitride or silicon dioxide, or any other suitable CMOS gate spacer material.

In some embodiments, the formation of the gate stack 284 may include dummy gate oxide deposition, dummy gate electrode (e.g., poly-Si) deposition, and patterning hardmask deposition. Additional processing may include patterning the dummy gates and depositing/etching spacer 283 material. Following such processes, the method may continue with insulator deposition, planarization, and then dummy gate electrode and gate oxide removal to expose the underlying channel region, such as is done for a replacement metal gate (RMG) process. After opening the channel region in the CMOS region of substrate 200, the dummy gate oxide and electrode may be replaced with, for example, a gate dielectric and a replacement metal gate, respectively. Other embodiments may include a standard gate stack formed by any suitable process, such as a subtractive process where the gate dielectric/gate metal is deposited and then followed by one or more etching processes. This particular sequence of gate stack formation may also be applied to the formation of the III-N transistors, as previously described.

Note that the CMOS region can be masked off when the gates 280 are formed in the RF switch/power amp/LNA region, and the RF switch/power amp/LNA region can be masked off when the gate spacers 283 and gate stacks 284 are formed, according to some embodiments. However, in other embodiments, further note that the gates 280 and spacers 283 and gate stacks 284 may be formed at least partially at the same time, such as the case where the recesses for the gates 280 and gate spacer/stack 283/284 are patterned and etched in the same set of process steps. Then, selective depositions and further processing can be used to fill the recesses with the corresponding gate materials, as will be appreciated.

Figure 2J:
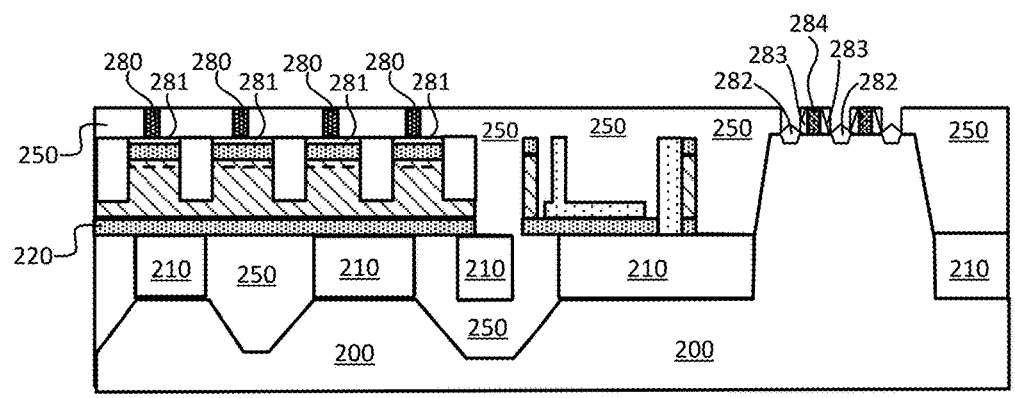

As further shown in FIG. 2J, method 100 of FIG. 1 continues with forming source and drain regions 282 for the CMOS region. According to some embodiments, the S/D regions 281 can be formed, for example, by patterning an appropriate mask and etching away STI material 250 as well as material of substrate 200 to each side of each channel region (and gate stack 284), followed by epitaxial regrowth of n-type S/D material. The S/D material may be, for example, silicon, germanium, or SiGe. The S/D material can be doped prior to deposition, during deposition (in situ), or after deposition (ion implantation) to provide the desired polarity of p-type or n-type. In still other embodiments, the S/D regions 282 can be formed, for example, by etching the STI 250 to expose the target S/D regions to each side of each gate stack 284, followed by ion implantation to dope the substrate 200 material as desired to form n-type and/or p-type S/D regions 282.

Figure 2K:
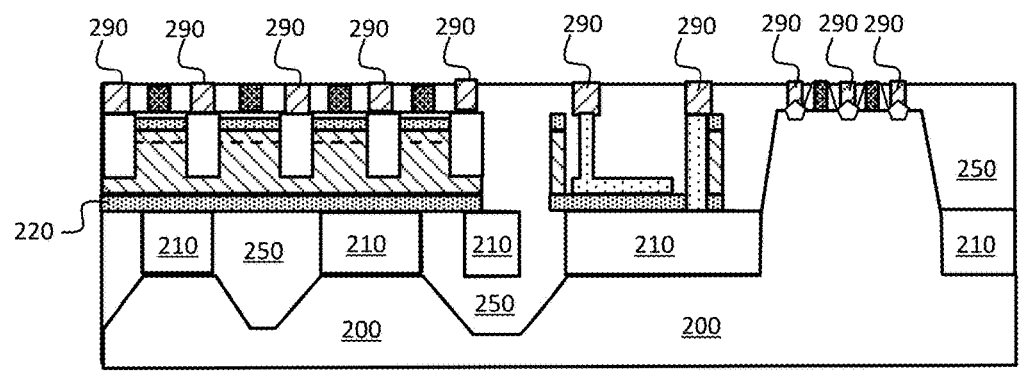

As further shown in FIG. 2K, trench contacts 290 may be simultaneously formed and metallized in each of the RF switch/power amp/LNA region, RF filter region, and CMOS region, according to some example embodiments. In alternative embodiments, the contacts 290 for the different regions can be formed separately, to accommodate different contact materials and/or forming processes, as needed. Any number of suitable patterning, etch, and deposition processes and material systems can be used to form trench contacts 290. The contact 290 material can be, for example, titanium, aluminum, tungsten, silver, nickel, or other suitable contact metals and alloys thereof. In some embodiments, contacts 290 may include a stack of contact material layers, such as one or more work function tuning metal layers, nucleation layers, resistance reducing layers, liner or barrier layers, in addition to metal plug layers.

Figure 2L:
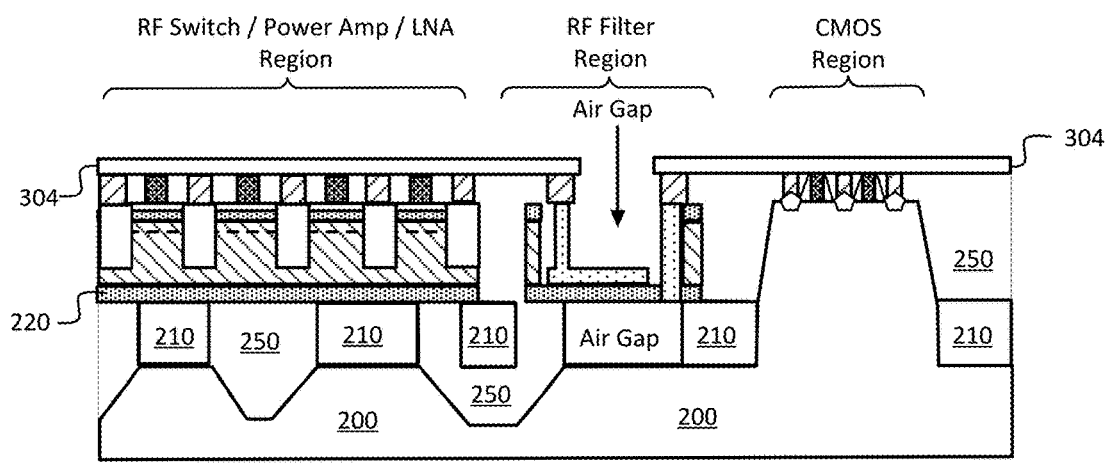

With respect to forming 124 one or more III-N RF filters in the second region of the structure, the methodology 100 further includes releasing the resonator structure in the RF filter region upon completion of the RF switch/power amp/LNA region and CMOS region, according to an embodiment. In accordance with some such example embodiments, a masking layer 304 may be applied to the RF switch/power amp/LNA region and the CMOS region, as shown in FIG. 2L, leaving the RF filter region unmasked. Masking layer 304 may comprise any material described with respect to masking material 300, protective layer 302, or any other suitable material as will be apparent in light of this disclosure (e.g., SiN or $SiO_2$). At least a portion of the additional STI material 250 in the RF filter region can then be etched after masking layer 304 is in place. In embodiments where the RF filter region includes an FBAR, such as the embodiment shown in FIG. 2L, etching the additional STI material 250 may release the resonator structure of the FBAR, forming an air gap above the top electrode 270 and below the piezoelectric layer 220, as shown in FIG. 2L. Masking layer 304 may subsequently be removed by any suitable technique. In some embodiments, the etch chemistry used to remove the additional STI material 250 is selective to the STI material 250 (i.e., it only removes the STI material 250 and doesn't remove (or otherwise only minimally removes) the other exposed materials. For example, a plasma etch of $NH_3$ and $NF_3$ can be used to remove STI 250 (e.g., $SiO_2$) and not remove (or otherwise only minimally remove) mask 304 (e.g., SiN) or electrodes 270 and 272.

Figure 2M:
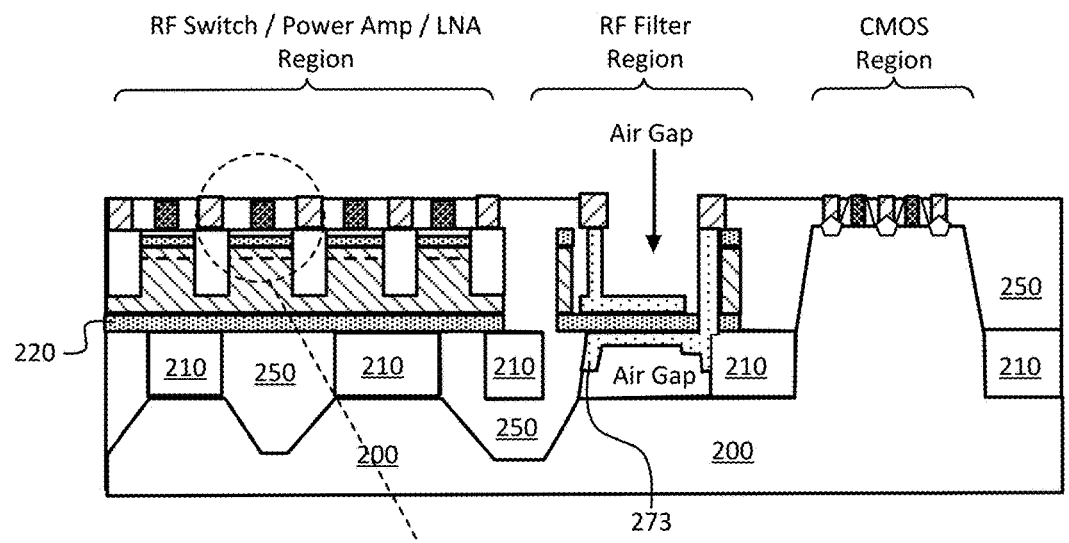
Figure 2M:
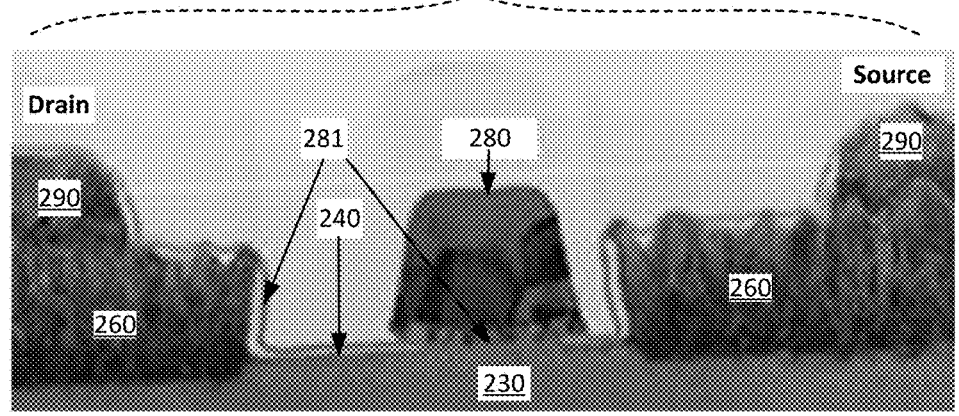

The methodology 100 of this example embodiment further includes finishing the bottom electrode 273 of the RF filter structure, as further shown in FIG. 2M. In some such embodiments, an ALD deposition processed is used to provide the electrode 273 metal, although any suitable deposition process can be used.

FIG. 2M' is a transmission electron microscopy (TEM) image illustrating a cross-sectional side view of an example III-N transistor formed in accordance with an embodiment of the present disclosure. As can be seen, the image illustrates gate 280 and gate dielectric layer 281 formed on III-N layer 230. Note the conformal nature of the gate dielectric 281, and how it extends from under the gate 280 and continues such that it at least partially covers the source and drain regions 260 that extend upward from the III-N layer 230, in this example embodiment. Further note in this example embodiment how the sloped walls of the source drain regions 260 which extend upward from the III-N layer 230 tend to track with the sloped walls of the gate 280. Thus, the gate dielectric 281 is sloped as well, as it conforms to the sloped upwardly extending sidewalls of source and drain regions 260. As further shown in FIG. 2M', polarization layer 240 is located between gate dielectric layer 281 and III-N layer 230 and although not visible in FIG. 2M', an additional III-N layer 232 may be formed between polarization layer 240 and III-N layer 230.

Note that the structures illustrated in FIGS. 2A-2M can be planar structures in some embodiments. In still other embodiments, the structures illustrated in FIGS. 2A-2M are non-planar structures such as fin-based structures, where the illustrated cross-section is taken parallel to the fin and through the fin. In such non-planar configurations, the fin may be implemented with one or more semiconductor materials arranged in a fin formation that extends from the substrate. The fin may be native to the substrate, or a deposition of material(s) on the fin. In one example embodiment, a given fin has a III-N portion (e.g., comprising one or more III-N materials) that includes the RF switch/power amp/LNA region and a column IV portion (e.g., comprising semiconductor material selected from group IV of the periodic table) that includes the CMOS region. As shown in the figures, an STI material can be used to isolate two distinct III-N and column IV fin portions. In still other embodiments, the non-planar fin configuration may be implemented with one or more nanowires (or nanoribbons, as the case may be) in the channel region in a so-called gate-all-around configuration. Numerous such non-planar configurations will be apparent in light of this disclosure, including FinFET, trigate, and nanowire configurations, in either or both of the III-N and CMOS IV transistors provisioned on the single substrate.

Upon analysis (e.g., using scanning/transmission electron microscopy (SEM/TEM), composition mapping, secondary ion mass spectrometry (SIMS), atom probe imaging, 3D tomography, etc.), a structure or device configured in accordance with one or more embodiments will effectively show the RF frontend componentry (e.g., GaN transistors, AlN RF filters, and other such III-N RF components) and CMOS devices on a common substrate or wafer.

Example System-on-Chip (SoC) Implementation

Figure 3:
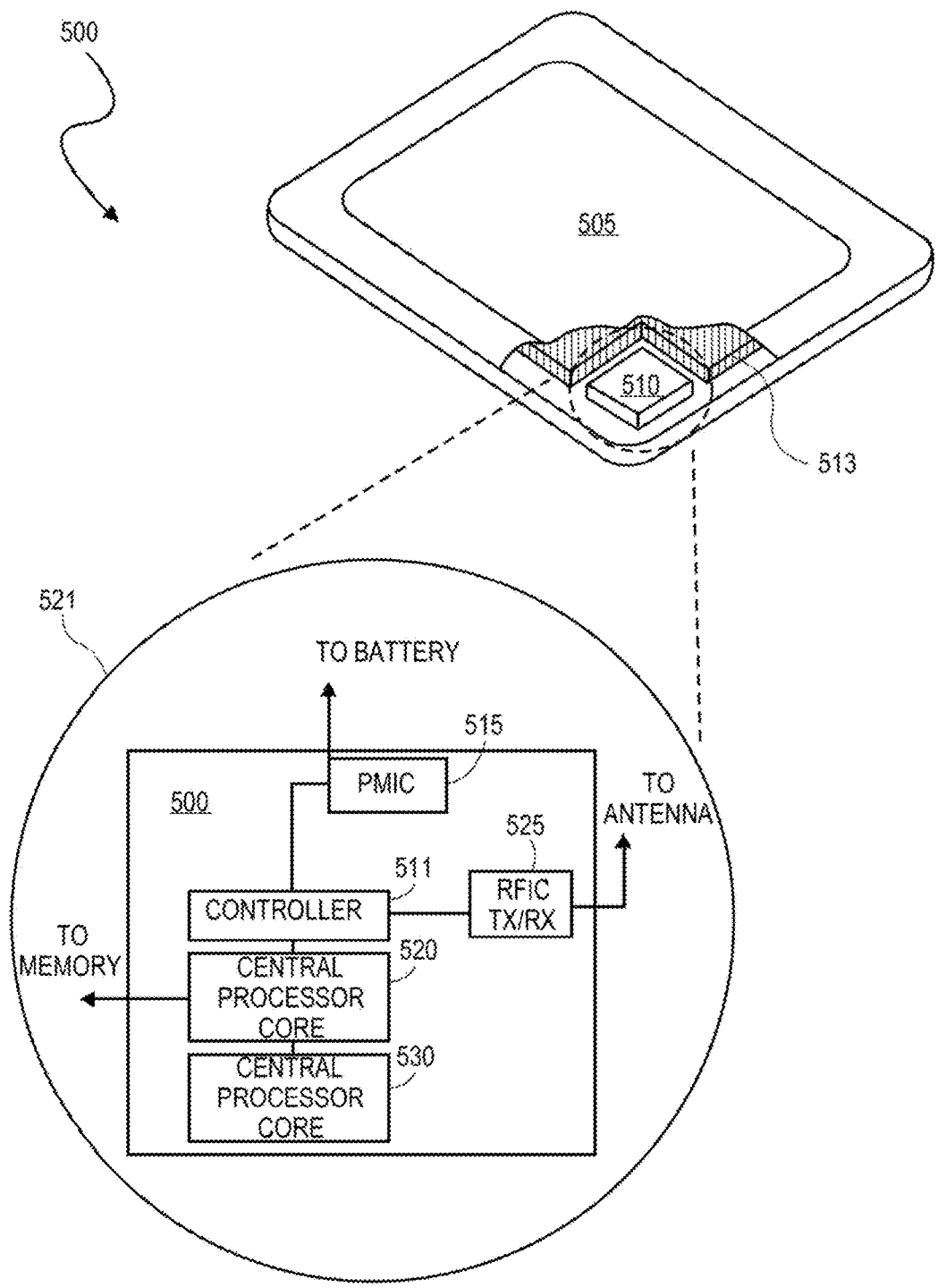
FIG. 3 illustrates a functional block diagram of a system-on-chip (SoC) implementation of a mobile computing platform, in accordance with various embodiments of the present disclosure.

FIG. 3 illustrates a functional block diagram of a SoC implementation of a mobile computing platform, in accordance with various embodiments of the present disclosure. The mobile computing platform 500 may be any portable device configured for each of electronic data display, electronic data processing, and wireless electronic data transmission. For example, mobile computing platform 500 may be a tablet, a smart phone, laptop computer, etc. and may include a display screen 505 that is in the exemplary embodiment a touchscreen (e.g., capacitive, inductive, resistive, etc.) permitting the receipt of user input. In addition, the platform 500 further includes SoC 510 and a battery 513. As illustrated, the greater the level of integration of the SoC 510, the more of the form factor within the mobile computing platform 500 that may be occupied by other componentry such as the battery 513 for longest operative lifetimes between charging, or by memory such as solid state memory.

Depending on its applications, mobile computing platform 500 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera and a mass storage device (such as hard disk drive, compact disk (CD), digital versatile disk (DVD), and so forth).

The SoC 510 is further illustrated in the expanded view 521. Depending on the embodiment, the SoC 510 may include a portion of a substrate (a chip) upon which two or more of the following are included: power management integrated circuitry (PMIC) 515; RF frontend integrated circuitry (RFIC) 525 including an RF transmitter and/or receiver; a controller thereof 511; and one or more central processor cores 520, 530. The RFIC 525 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 525 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 515 and RFIC 525. In embodiments of the present disclosure, the PMIC 515 and/or RFIC 525 employ one or more of the integrated circuit structures (e.g., including one or more GaN transistors, III-N RF filters and/or CMOS devices) as variously described herein. In further embodiments, the PMIC 515 and RFIC 525 employing the integrated circuit structures described herein may be integrated with one or more of the controller 511 and processor cores 520, 530 provided in, e.g., Si CMOS technology monolithically integrated with the PMIC 515 and/or RFIC 525 onto a single substrate (e.g., substrate 200 as variously described herein). It will be appreciated that within the PMIC 515 and/or RFIC 525, the III-N transistors and/or III-N RF filters described herein need not be utilized in exclusion to CMOS, but rather other CMOS devices may be further included in each of the PMIC 515 and RFIC 525 or otherwise operatively coupled thereto but within the overall confines of the SoC 510.

As further illustrated in the example embodiment of FIG. 3, the PMIC 515 has an output coupled to an antenna and may further have an input coupled to a communication module on the SoC 510, such as a backend RF analog and digital baseband module (not depicted). Alternatively, such communication modules may be provided on an IC off-chip from the SoC 510 and coupled into the SoC 510 for transmission. As can be understood based on the present disclosure techniques variously described herein allow III-N transistors and/or III-N RF filters to be formed on Si, SiGe, Ge, and other column IV substrates.

Example System

Figure 4:
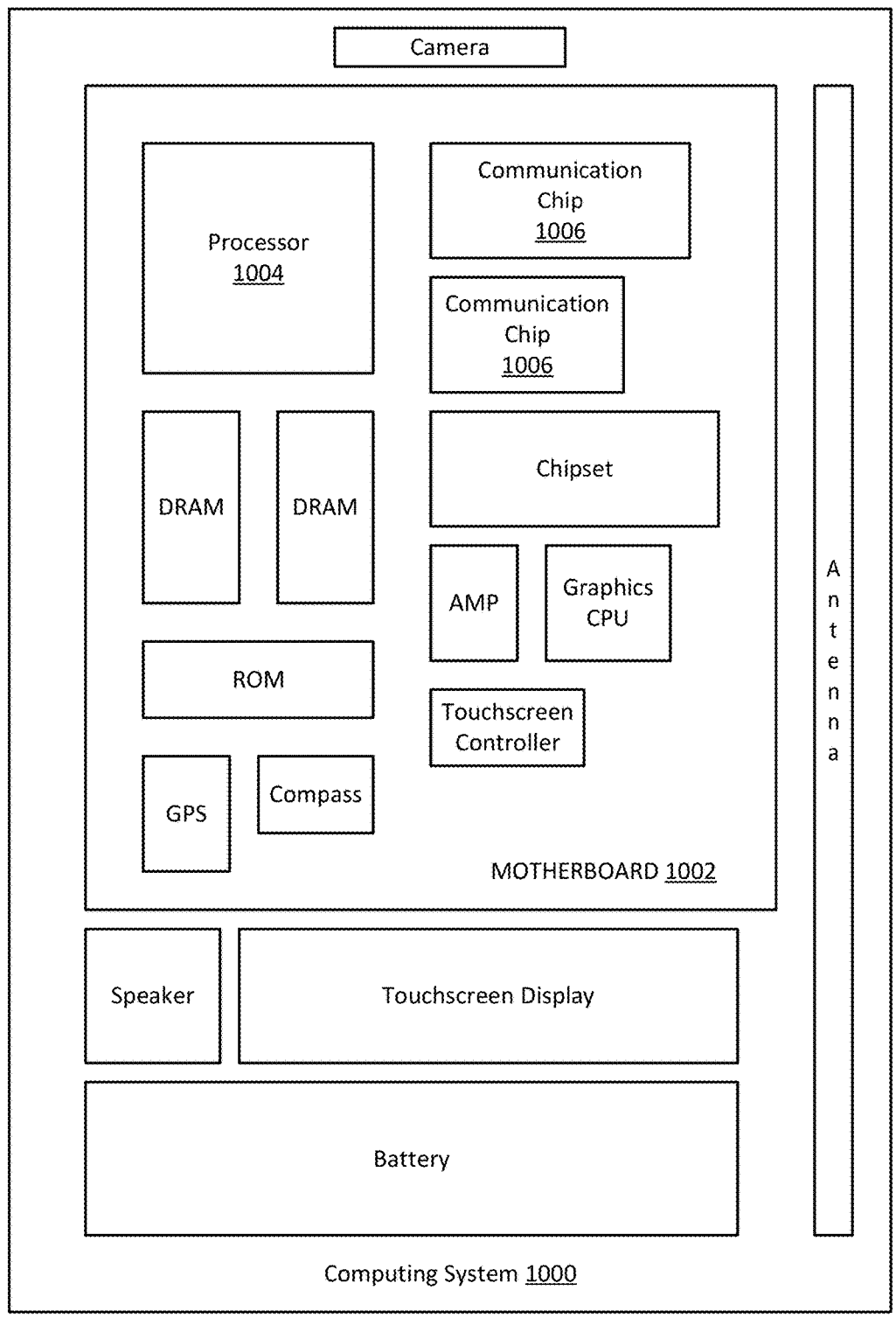
FIG. 4 illustrates an example computing system implemented with one or more integrated circuit structures or devices formed using the techniques disclosed herein, in accordance with various embodiments of the present disclosure.

FIG. 4 illustrates a computing system 1000 implemented with integrated circuit structures or devices formed using the techniques disclosed herein, in accordance with various embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, the communication chip 1006 is implemented with or otherwise includes an SoC RF frontend chip having III-N and CMOS technology monolithically integrated therein. The RF frontend includes one or more of each of the following: RF power amplifiers, RF switches, RF filters, and LNAs, according to some embodiments. In a more general sense, the RF frontend may include the hardware used to convert an RF wireless signal received by an antenna and to frequency down-convert (e.g., RF to intermediate frequency in some embodiments, and further including intermediate frequency to baseband frequency in still other embodiments), amplify, filter, or otherwise prepare that signal for processing at a subsequent baseband stage.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., an IC comprising one or more III-N-based RF transistors, RF filters and/or CMOS devices monolithically integrated on a substrate) formed using the disclosed techniques, as variously described herein. The term "processor" may refer to any device or portion of a device that processes, for instance, electronic data from registers and/or memory to transform that electronic data into other electronic data that may be stored in registers and/or memory. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device including: a single column IV semiconductor substrate; a radio frequency (RF) frontend on a first region of the substrate, the RF frontend including a III-nitride (III-N) transistor and a III-N RF filter; and a CMOS device on a second region of the substrate, the CMOS device including at least one of silicon, germanium, and silicon germanium (SiGe).

Example 2 includes the subject matter of Example 1, wherein at least one of the III-N transistor and the III-N RF filter includes a III-N layer including at least 50% III-N compound by weight Example 3 includes the subject matter of Example 2, wherein the III-N layer of the III-N transistor and the III-N layer of the III-N RF filter each include at least 50% III-N compound by weight.

Example 4 includes the subject matter of Example 2, wherein either the III-N transistor or the III-N RF filter includes a III-N layer including at least 50% III-N compound by weight.

Example 5 includes the subject matter of Example 2, wherein the substrate includes at least one material selected from the group consisting of silicon, silicon germanium (SiGe), and germanium.

Example 6 includes the subject matter of any of Examples 1-5, wherein at least one of the III-N transistor and the III-N RF filter includes a nucleation layer on the substrate.

Example 7 includes the subject matter Example 6, wherein the nucleation layer includes at least one material selected from the group consisting of aluminum nitride, aluminum indium nitride, aluminum gallium nitride, indium gallium nitride, aluminum indium gallium nitride and gallium nitride.

Example 8 includes the subject matter of any of Examples 1-7, wherein the III-N transistor includes a polarization layer above a layer including gallium nitride (GaN), and the III-N RF filter includes a piezoelectric layer sandwiched between a top and a bottom electrode.

Example 9 includes the subject matter of Example 8, wherein the polarization layer includes at least one material selected from the group consisting of aluminum nitride, aluminum gallium nitride, indium aluminum nitride and indium aluminum gallium nitride.

Example 10 includes the subject matter of any of Examples 1-9, wherein the first region of the substrate includes a power amplifier, an RF switch, and a low noise amplifier (LNA).

Example 11 includes the subject matter of any of Examples 1-10, wherein the first region of the substrate includes one or more GaN transistors and one or more III-N RF filters.

Example 12 includes the subject matter of any of Examples 1-11, wherein the III-N RF filter includes a surface acoustic wave filter, a temperature-compensated surface acoustic wave filter, a bulk acoustic wave filter or a thin-film bulk acoustic resonator.

Example 13 includes the subject matter of any of Examples 1-12, wherein at least one of the III-N transistor and the CMOS device includes a FinFET or a nanowire configuration.

Example 14 includes the subject matter of any of Examples 1-13, wherein the III-N transistor includes a geometry selected from the group consisting of a high-electron-mobility transistor (HEMT) architecture, a pseudo-morphic HEMT (pHEMT) architecture, a two-dimensional electron gas (2DEG) architecture, a three-dimensional electron gas (3DEG) architecture, a multiple quantum-well (MQW) architecture, and a super-lattice architecture.

Example 15 is a system-on-chip (SoC) including the subject matter of any of Examples 1-14.

Example 16 is a computing system including the subject matter of any of Examples 1-15.

Example 17 is a system-on-chip (SoC) integrated circuit that includes: a substrate comprising a material selected from column IV of the periodic table; a gallium nitride (GaN) transistor and a III-nitride (III-N) RF filter on a first region of the substrate; and a CMOS device on a second region of the substrate, the CMOS device comprising at least one material selected from the group consisting of silicon, germanium, and silicon germanium (SiGe).

Example 18 includes the subject matter of example 17, wherein the GaN transistor includes a GaN layer that includes at least 50% gallium nitride by weight.

Example 19 includes the subject matter of Examples 17-18, wherein the GaN transistor includes a GaN layer that includes at least 75% gallium nitride by weight.

Example 20 includes the subject matter of any of Examples 17-19, wherein the substrate comprises at least one material selected from the group consisting of silicon, silicon germanium (SiGe), and germanium.

Example 21 includes the subject matter of any of Examples 17-20, wherein the GaN transistor includes a nucleation layer including at least one III-N material and the nucleation layer also serves as a piezoelectric layer of the III-N RF filter, and the integrated circuit further includes a shallow trench isolation (STI) material that separates the III-N nucleation layer of the GaN transistor from the piezoelectric layer of the III-N RF filter.

Example 22 includes the subject matter of Example 21, wherein the nucleation layer is selected from the group consisting of aluminum nitride, aluminum indium nitride, aluminum gallium nitride, indium gallium nitride, aluminum indium gallium nitride and gallium nitride.

Example 23 includes the subject matter of any of Examples 17-22, wherein the GaN transistor further includes a polarization layer above a GaN layer.

Example 24 includes the subject matter of Example 23, wherein the polarization layer includes at least one material selected from the group consisting of aluminum nitride, aluminum gallium nitride, indium aluminum nitride and indium aluminum gallium nitride.

Example 25 includes the subject matter of any of Examples 17-24, wherein the device includes one or more power amplifiers, RF switches, and low noise amplifiers.

Example 26 includes the subject matter of any of Examples 17-25, wherein the III-N RF filter includes a surface acoustic wave filter, a temperature-compensated surface acoustic wave filter, a bulk acoustic wave filter or a thin-film bulk acoustic resonator.

Example 27 includes the subject matter of any of Examples 17-26, wherein at least one of the GaN transistor and the CMOS device includes a FinFET or a nanowire configuration.

Example 28 is a computing system that includes the subject matter of any of Examples 17-27.

Example 29 is a method of forming a monolithic integrated circuit, the method including: providing a substrate including a material selected from group IV of the periodic table; forming a III-nitride (III-N) transistor and a III-N RF filter on a first region of the substrate; and forming a CMOS device on a second region of the substrate, the CMOS device comprising at least one material selected from the group consisting of silicon, germanium, and silicon germanium (SiGe).

Example 30 includes the subject matter of Example 29, wherein forming the III-N transistor and the III-N RF filter includes depositing a polarization layer on a GaN layer, wherein the polarization layer comprises at least one material selected from the group consisting of aluminum nitride, aluminum gallium nitride, indium aluminum nitride, and indium aluminum gallium nitride.

Example 31 includes the subject matter of any of Examples 29-30, wherein forming the III-N transistor and the III-N RF filter includes depositing a nucleation layer on the substrate and depositing a GaN layer on the nucleation layer, wherein the nucleation layer is selected from the group consisting of aluminum nitride, aluminum indium nitride, aluminum gallium nitride, indium gallium nitride, aluminum indium gallium nitride and gallium nitride.

Example 32 includes the subject matter of any of Examples 29-31 and further includes depositing a first shallow trench isolation (STI) material on the substrate to isolate the III-N transistor from the III-N RF filter and a second STI material to isolate the CMOS device from the III-N transistor and the III-N RF filter.

Example 33 includes the subject matter of any of Examples 29-32, wherein the III-N RF filter includes a surface acoustic wave filter, a temperature-compensated surface acoustic wave filter, a bulk acoustic wave filter or a thin-film bulk acoustic resonator.

Example 34 includes the subject matter of any of Examples 29-33, wherein forming the III-N RF filter includes etching a shallow trench isolation (STI) material to release a resonator structure of the III-N RF filter.

Example 35 includes the subject matter of Example 34, wherein the III-N RF filter includes a thin-film bulk acoustic resonator.

Example 36 is an integrated circuit formed by the subject matter of any of Examples 29-35.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a substrate comprising a material selected from column IV of the periodic table;
   a transistor and an RF filter, each at least one of on and over a first region of a substrate, the transistor and the RF filter each comprising a III-nitride (III-N) material that comprises nitrogen and one or more of gallium, indium, and aluminum; and
   a complementary metal oxide semiconductor (CMOS) device at least one of on and over a second region of the substrate, the CMOS device comprising at least one of silicon and germanium.

2. The integrated circuit of claim 1, wherein at least one of the transistor and the RF filter comprises a layer that comprises at least 50% III-N compound by weight.

3. The integrated circuit of claim 2, wherein the layer of the transistor and the layer of the RF filter each comprise at least 50% III-N compound by weight.

4. The integrated circuit of claim 2, wherein the III-N material of the transistor is distinct from the III-N material of the RF filter.

5. The integrated circuit of claim 1, wherein the substrate comprises at least one silicon and germanium.

6. The integrated circuit of claim 1, wherein at least one of the transistor and the RF filter comprises a nucleation layer that comprises nitrogen and at least one of aluminum, indium, and gallium.

7. The integrated circuit of claim 1, wherein the transistor comprises a first layer above a second layer, the second layer comprising gallium and nitrogen, and the first layer comprises nitrogen and at least one of aluminum, gallium, and indium, and the RF filter comprises a third layer between top and bottom electrodes, the third layer comprising a piezoelectric material.

8. The integrated circuit of claim 1, wherein the RF filter includes a surface acoustic wave filter, a temperature-compensated surface acoustic wave filter, a bulk acoustic wave filter, or a thin-film bulk acoustic resonator, and at least one of the transistor and the CMOS device includes a FinFET or a nanowire configuration.

9. A computing system comprising the integrated circuit of claim 1.

10. A system-on-chip (SoC) integrated circuit, comprising:
    a substrate comprising a material selected from column IV of the periodic table;
    a gallium nitride (GaN) transistor and a III-nitride (III-N) RF filter at least one of on and over a first region of the substrate; and
    a CMOS device at least one of on and over a second region of the substrate, the CMOS device comprising at least one material selected from the group consisting of silicon, germanium, and silicon germanium (SiGe).

11. The integrated circuit of claim 10, wherein the GaN transistor comprises a GaN layer that comprises at least 50% gallium nitride by weight.

12. The integrated circuit of claim 10, wherein the substrate comprises at least one material selected from the group consisting of silicon, silicon germanium (SiGe), and germanium.

13. The integrated circuit of claim 10, wherein the GaN transistor comprises a nucleation layer comprising at least one III-N material and the nucleation layer also serves as a piezoelectric layer of the III-N RF filter, and the integrated circuit further comprises a shallow trench isolation (STI) material that separates the III-N nucleation layer of the GaN transistor from the piezoelectric layer of the III-N RF filter.

14. The integrated circuit of claim 10, wherein the GaN transistor further comprises a polarization layer above a GaN layer, the GaN layer comprises at least 50% gallium nitride by weight, and the polarization layer comprises at least one material selected from the group consisting of aluminum nitride, aluminum gallium nitride, indium aluminum nitride and indium aluminum gallium nitride.

15. A computing system comprising the integrated circuit of claim 10.

16. A method of forming a monolithic integrated circuit, the method comprising:

forming a transistor and an RF filter at least one of on and over a first region of a substrate, the substrate comprising a material selected from group IV of the periodic table, the transistor and the RF filter each comprising a III-nitride (III-N) material that comprises nitrogen and one or more of gallium, indium, and aluminum; and forming a complementary metal oxide semiconductor (CMOS) device at least one of on and over a second region of the substrate, the CMOS device comprising at least one of silicon and silicon germanium.

17. The method of claim 16, wherein forming the transistor and the RF filter comprises depositing a first layer on a second layer, wherein the first layer comprises nitrogen and at least one of aluminum, gallium, and indium.

18. The method of claim 16, wherein forming the transistor and the RF filter comprises depositing a first layer on the substrate and depositing a second layer on the first layer, wherein the first layer is selected from the group consisting of aluminum nitride, aluminum indium nitride, aluminum gallium nitride, indium gallium nitride, aluminum indium gallium nitride and gallium nitride.

19. The method of claim 16, further comprising depositing shallow trench isolation (STI) material on the substrate to isolate the transistor from the RF filter, and depositing STI material to isolate the CMOS device from the transistor and the RF filter.

20. The method of claim 16, wherein forming the RF filter comprises etching an insulator material to release a resonator structure of the RF filter.

* * * * *